United States Patent [19]
Lee et al.

[11] Patent Number: 5,747,356
[45] Date of Patent: May 5, 1998

[54] METHOD FOR MANUFACTURING ISRC MOSFET

[75] Inventors: Jong Duk Lee, Department of Electronics Engineering College of Engineering, Seoul National, University, Shin Lim-dong, Kwanak-ku, Seoul; Kuk Jin Chun, Seoul; Byung Gook Park, Seoul; Jeong Ho Lyu, Seoul, all of Rep. of Korea

[73] Assignees: Korea Information & Communication Co., Ltd.; Jong Duk Lee, both of Seoul, Rep. of Korea

[21] Appl. No.: 760,490

[22] Filed: Dec. 5, 1996

[30] Foreign Application Priority Data

Dec. 6, 1995 [KR] Rep. of Korea ............... 1995-48511

[51] Int. Cl.$^6$ ................................................. H01L 21/265
[52] U.S. Cl. ..................... 437/44; 437/41; 437/45; 437/69; 148/DIG. 82
[58] Field of Search ......................... 437/40, 41, 44, 437/45, 69; 148/DIG. 82

[56] References Cited

U.S. PATENT DOCUMENTS

| | | |
|---|---|---|
| 5,427,971 | 6/1995 | Lee et al. ............................. 437/44 |
| 5,434,093 | 7/1995 | Chau et al. ........................... 437/41 |
| 5,464,782 | 11/1995 | Koh ..................................... 437/45 |
| 5,472,897 | 12/1995 | Hsu et al. ............................. 437/45 |
| 5,534,447 | 7/1996 | Hong ................................... 437/44 |
| 5,538,913 | 7/1996 | Hong ................................... 437/44 |

*Primary Examiner*—Tuan H. Nguyen
*Attorney, Agent, or Firm*—Dilworth & Barrese

[57] ABSTRACT

The present invention privides a method for manufacturing an ISRC MOSFET, comprising steps of forming an isolating layer through the LOCOS process, depositing a mask oxide layer, exposing only the part of silicon substrate for forming the channel and shallow junction of source/drain layers, depositing the first nitride layer over the resultant substrate, dry-etching the first nitride layer to form a nitride side-wall, forming an oxide layer being recessed into the channel, wet-etching the nitride side-wall, forming two doped layers for the shallow source/drain by an $N^+$ or $P^+$ ion-implantation, depositing the second nitride layer, dry-etching for forming a nitride side-wall, forming a $P^-$ or $N^-$ doped layer between the two doped layers, forming a gate oxide layer on the $P^-$ or $N^-$ doped layer, depositing a poly-silicon layer, forming a poly-silicon gate by a llithography process and a dry-etching process, etching away the mask oxide layer, and ion-implanting for thick source/drain junction.

6 Claims, 3 Drawing Sheets

METHOD FOR MANUFACTURING ISRC MOSFET

BACKGROUND OF THE INVENTION

1. Field of the Invention

The present invention relates to a method for manufacturing an ISRC (Inverted-Sidewall Recessed-Channel MOSFET (Metal Oxide Semiconductor Field Effect Transistor)), which can be used for semiconductor memory chips or high speed transistors.

2. Description of the Prior Art

In accordance with rapid development of techniques for the manufacturing of semiconductor chips, memory chips with large capacity storage and other chips with high operating speeds have been developed.

Recently, MOSFETs with gate lengthes of the 0.1 µm class have been fabricated using a conventional structure like LDD (Lightly Doped Drain).

For forming the gate, an oxidation process and a poly-silicon deposition process are sequentially performed for the first step. A lithography process for forming the gate pattern on the poly-silicon layer is then carried out and thereafter the gates are formed by dry-etching of the poly-silicon layer. The MOSFET device inclusive of the above gates is obtained through some other additional processes following the dry etching process.

While etching the poly-silicon layer, the thin oxide layer should not be etched, necessitating a high selectivity. However, it is very difficult to get high selectivity in the dry-etching process. Further, the MOSFET devices with the conventional structure have such disadvantages that its operating speed is relatively slow since the junction capacity of the source/drain region is large and that the punchthrough phenomenon occurs as usual in the short channel devices.

In fabricating such short channel MOSFETs below sub-quarter micrometer by using the conventional structure, it is very difficult to obtain the short length gate and to form the shallow source/drain junction.

In addition, the reliability of the device is affected by the hot carriers generated in the device.

SUMMARY OF THE INVENTION

As the present invention has been made in view of the above-mentioned problems involved in the prior art, the object of the present invention is to provide a method for manufacturing an ISRC MOSFET which facilitates the formation of short length gate and shallow source/drain junction so as to be applied for memory chips such as DRAMs of more than giga bytes or for circuits requiring rapid operating frequencies.

To accomplish the object of the present invention, there is provided a method for forming the source/drain with relatively shallow junction by seletively recessing the channel region and selectively doping the source/drain through the formation of side-wall nitride layers.

According to the present invention, a new manufacturing method has been developed, which can overcome the working limit of the conventional lithography process and obtain elements with the channel lengthes of less than 0.1 µm. The decreased junction capacity due to the separate formation of the channel and source/drain regions contributes to increase the operating speed.

The method of the present invention also can reduce the outbreak of the punchthrough phenomenon by uneven lateral doping of the source/drain and enhance the reliability of the elements by reducing generation of the hot carriers.

BRIEF DESCRIPTION OF THE DRAWINGS

The above object and other advantages of the present invention will become more apparent by the following detailed description of the preferred embodiment thereof with reference to the accompanying drawings, in which.

DESCRIPTION OF THE PREFERRED EMBODIMENTS

Hereinafter, the present invention will be described in detail with reference to the accompanying drawings and in comparison with the conventional method.

Figure 1:
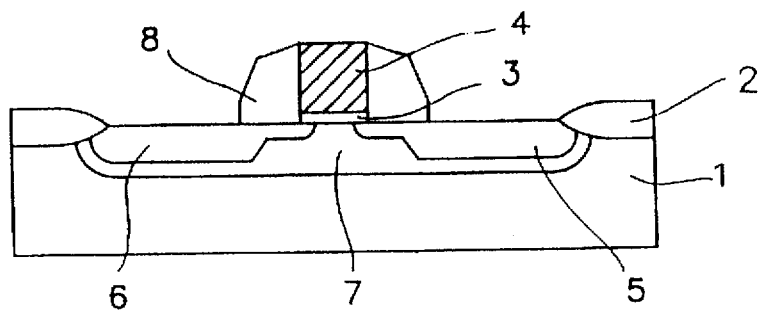
FIG. 1 is a cross-sectional view showing the shape of a conventional MOSFET.

The shape of a conventional MOSFET device is shown in FIG. 1. A MOSFET with the conventional LDD structure comprises an isolating oxide layer 2 formed on a silicon substrate 1, the opposite $N^+$ doped drain layer 5 and source layer 6 surrounded by the isolating oxide layer 2, a gate oxide layer 3 formed across the space between the drain layer 5 and the source layer 6, a poly-silicon gate 4 formed on the gate oxide layer 3, a side-wall oxide layer 8 which is formed over the $N^+$ doped drain layer 5 and source layer 6 and surrounding the gate oxide layer 3 and the poly-silicon gate 4, and a $P^-$ doped silicon layer 7 formed under the drain layer 5 and the source layer 6 and extending to the isolating oxide layer.

A method for manufacturing the conventional MOSFET with the LDD structure is shown in FIGS. 2A to 2E.

Figure 2A:
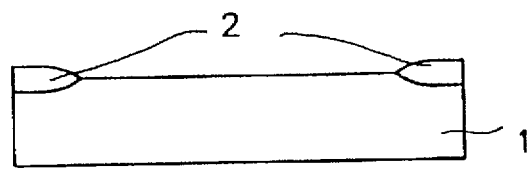
FIGS. 2A–2E are cross-sectional views showing the steps for manufacturing a conventional MOSFET.
Figure 2B:
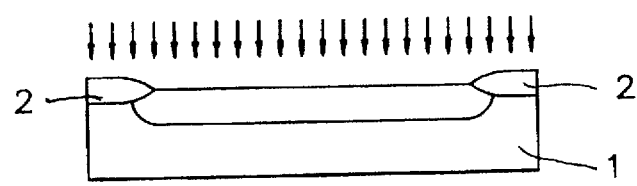
Figure 2C:
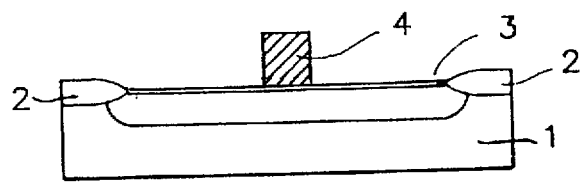

An Isolating layer 2 is formed through the LOCOS (Local Oxidation of Silicon) process in order to fix the boundaries among the neighboring elements [FIG. 2a]. As shown in FIG. 2b, an ion-implantation process is then carried out for doping the channel. Then, the upper part of the doped layer is oxidized to form a gate oxide layer 3. Thereafter, a poly-silicon layer is deposited over the oxide layer 3 and a lithography process for patterning the gate and a dry-etching process are sequentially performed so that the poly-silicon gate 4 with the cross-sectional shape as shown in FIG. 2c may be formed.

Meanwhile, the above dry-etching process has to be carried out with the high selectivity because the gate oxide layer 3 should be formed with a thickness of about 40 Å for the elements with the 0.1 µm class gate length. For forming such a short length gate, an electron beam process, an X-ray lithography process and a photoresist ashing process, etc. should be employed.

Figure 2D:
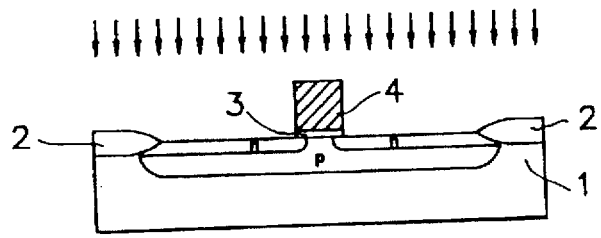

Further, as shown in FIG. 2d, an ion-implantation process with low energy and high concentration dose is carried out to form shallow source/drain junction and obtain high current level, resulting in formation of p-type and n-type doped layers.

Figure 2E:
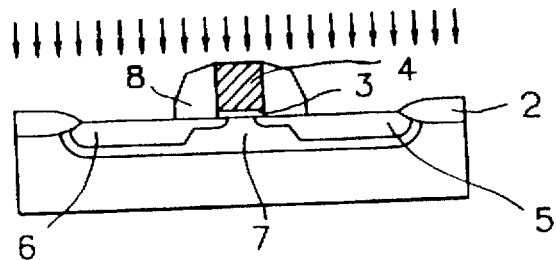

Then, a side-wall oxide layer 8 is formed around the poly-silicon gate 4. An ion-implantation process is carried out again so that the thickness of the source 6 and drain 5 layers around the side-wall oxide layer 8 may be thickened as shown in FIG. 2e. After the ion-implantation process, the implanted ions are then activated by heat treatment.

Some other processes including depositing of an insulating substance, making holes in the source/drain layers, deposition of a metal, a lithography process for wiring pattern and a metal etching process are sequentially carried out thereafter. In addition, a resistance contact between the metal and the source layer or the drain layer is finally formed by a heat treatment at low temperatures.

Figure 3:
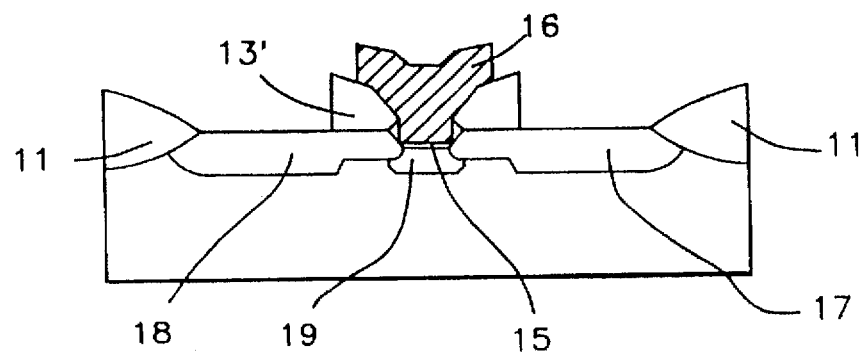
FIG. 3 is a cross-sectional view showing the shape of an ISRC MOSFET according to the present invention; and, FIGS. 4A–4F are cross-sectional views showing the steps for manufacturing an ISRC MOSFET according to the present invention.

FIG. 3 is an enlarged cross-sectional view of an ISRC MOS FET according to the present invention, wherein the MOSFET comprises an isolating oxide layer 11 formed in a silicon substrate 10, an $N^+$-doped drain layer 17 and a source layer 18 formed in the isolating oxide layer 11, a $P^-$-doped silicon layer 19 formed in the lower space between the $N^+$-doped drain layer 17 and source layer 18, a gate oxide layer 15 formed on the $p^-$-doped silicon layer 19 and contacted with and between the drain layer 17 and the source layer 18, a poly-silicon gate 16 formed on the gate oxide layer 15, and a side-wall nitride layer 13' formed on the neighboring edge portions of the drain layer 17 and the source layer 18 and surrounding the poly-silicon gate 16.

FIGS. 4 (a) to (f) are cross-sectional views showing the steps for manufacturing an ISRC MOSFET according to an embodiment of the present invention.

First, an isolating layer 11 is formed on a silicon substrate 10 through the LOCOS process in order to form the boundaries among the neighboring elements. Then, a mask oxide layer 12 is deposited over the whole substrate for forming a channel.

Figure 4A:
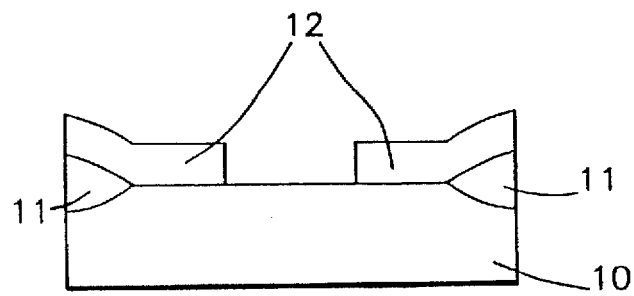

Then, after a lithography process, the central portion of the mask oxide layer 12 is etched away so that only the part of the silicon substrate 10 for forming the channel and the shallow junction of the source/drain layers may be exposed, as shown in FIG. 4a.

Figure 4B:
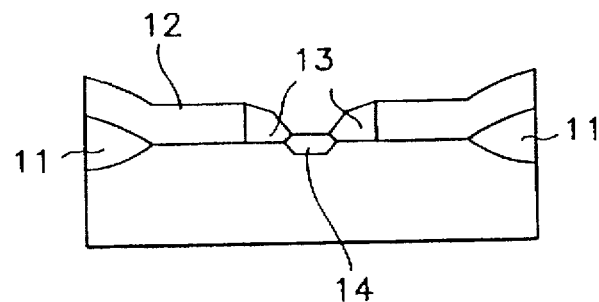

A nitride layer is then deposited over the resultant substrate, a dry-etching process of the nitride layer is carried out so as to form a nitride side-wall 13 and thereafter an oxidation process is carried out to form an oxide layer 14 being recessed into the channel as shown in FIG. 4b.

According to the deposition thickness and the etched amount of the nitride layer in FIG. 4b step, the distance between the source and drain layers that will be formed in the following step is determined.

Figure 4C:
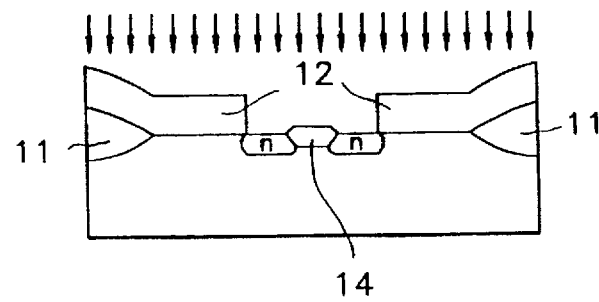

The nitride side-wall 13 is etched away through wet etching process and then an ion-implantation process for forming the shallow junction of source/drain layers is carried out so that, as shown in FIG. 4c, two $N^+$ doped layers may be formed.

A nitride layer is deposited again by the same method as in FIG. 4b and a dry-etching process is carried out so as to form a nitride side-wall 13'.

Figure 4D:
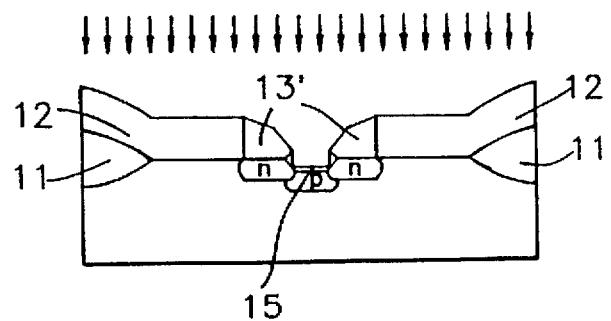

Then, after dry-etching the oxide layer 14, an ion-implantation process for adjusting the threshold voltage and preventing the punchthrough phenomenon is carried out so that a $P^-$ doped layer may be formed between the two $N^+$ doped layers with its both side edges under the $N^+$ doped layers as shown in FIG. 4d. A gate oxide layer 15 is then formed on the $P^-$ doped layer.

Figure 4E:
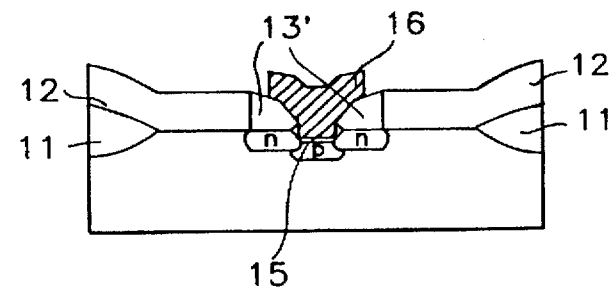

A poly-silicon layer is deposited over the whole substrate formed as in FIG. 4d and then a lithography process and a dry-etching process are sequentially carried out to form a poly-silicon gate 16 with the shape shown in FIG. 4e.

Meanwhile, because the above poly-silicon layer is deposited on the nitride layer 13', the dry-etching process for forming a gate pattern can be carried out easily without any particular requisites.

Figure 4F:
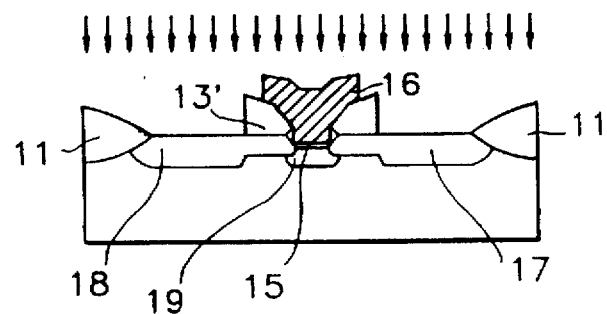

The mask oxide layer 12 is then etched away and an ion-implantation process for forming thick source/drain junction is carried out to obtain a shape with the cross-sectional view shown in FIG. 4f.

Then, an oxide layer is deposited over the above whole substrate and contact holes are made therein so that a metal wiring may be formed thereon.

Beside the above embodiment, a pMOSFET may be fabricated by doping the drain layer 17 and the source layer 18 with $P^+$ ions and doping the silicon layer 19 with $N^-$ ions. Further, an ISRC CMOSFET may be obtained by fabricating the nMOSFET and the pMOSFET together on the same substrate 10.

According to the present invention, by forming the gate through the formation of the nitride side-wall layer, the working limit of the conventional lithography process is overcome and thus an element with the channel lengthes of less than 0.1 μm can be made. Moreover, by recessing a part of the channel region, the shallow source/drain can be easily obtained. The operating speed of the resulting MOSFET is increased, as the channel region and the source/drain region are isolatedly formed, reducing the junction capacity.

In addition, the method of the present invention also can decrease the outbreak of the punchthrough phenomenon by laterally uneven doped shape of the channel and the source/drain and enhance the reliability of the element by the reducing the hot carriers generated.

Although the preferred embodiment of the invention has been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing an inverted-sidewall recessed-channel metal-oxide-semiconductor field effect transistor, comprising the steps of:

forming an isolating layer on a silicon substrate through the LOCOS process in order to form the boundaries among the neighboring elements;

depositing a mask oxide layer over the whole silicon substrate;

exposing only the part of the silicon substrate for forming the channel and shallow junction of source/drain layers;

depositing a first nitride layer over the resultant substrate;

dry-etching the said first nitride layer so as to form a first nitride side-wall;

forming an oxide layer being recessed into the channel by an oxidation process;

wet-etching away the said first nitride side-wall;

forming two doped layers for the shallow source/drain by an ion-implantation process;

depositing a second nitride layer over the resultant substrate;

dry-etching the said second nitride layer and the oxide layer so as to form a second nitride side-wall;

forming a doped layer between the two doped layers for adjusting the threshold voltage and preventing the punchthrough phenomenon by an ion-implantation process;

forming a gate oxide layer on the doped layer depositing a poly-silicon layer over the resultant substrate forming a poly-silicon gate by a lithography process and a dry-etching process;

etching away the mask oxide layer; and, ion-implanting for thick source/drain junction.

2. A method for manufacturing an inverted-sidewall recessed-channel metal-oxide-semiconductor field effect transistor as claimed in claim 1, wherein the said two doped layers for the shallow source/drain is formed by $N^+$ ion-implantation process and the said doped layer between the said two doped layers for adjusting the threshold voltage and preventing the punchthrough phenomenon is formed by $P^-$ ion-implantation process.

3. A method for manufacturing an inverted-sidewall recessed-channel metal-oxide-semiconductor field effect transistor as claimed in claim 2, wherein the distance between the said source and drain layers is determined by adjusting the gap between the nitride opposite side-walls of the said first nitride layer according to the deposition thickness and the etched amount of the said side-walls.

4. A method for manufacturing an inverted-sidewall recessed-channel metal-oxide-semiconductor field effect transistor as claimed in claim 1, wherein the said two doped layers for the shallow source/drain is formed by $P^+$ ion-implantation and the said doped layer between the said two doped layers for adjusting the threshold voltage and preventing the punchthrough phenomenon is formed by $N^-$ ion-implantation process.

5. A method for manufacturing an inverted-sidewall recessed-channel metal-oxide-semiconductor field effect transistor as claimed in claim 4, wherein the distance between the said source and drain layers is determined by adjusting the gap between the nitride opposite side-walls of the said first nitride layer according to the deposition thickness and the etched amount of the said side-walls.

6. A method for manufacturing an inverted-sidewall recessed-channel metal-oxide-semiconductor field effect transistor as claimed in claim 1, wherein the distance between the said source and drain layers is determined by adjusting the gap between the nitride opposite side-walls of the said first nitride layer according to the deposition thickness and the etched amount of the said side-walls.

* * * * *